United States Patent [19]
Wallace et al.

[11] Patent Number: 6,147,653
[45] Date of Patent: Nov. 14, 2000

[54] BALANCED DIPOLE ANTENNA FOR MOBILE PHONES

[76] Inventors: Raymond C. Wallace, 4065 Lark St., San Diego, Calif. 92103; Ernest T. Ozaki, 13844 Sagewood Dr., Poway, Calif. 92064; Allen Minh-Triet Tran, 7529 Flower Meadow Dr., San Diego, Calif. 91216; Guy Klemens, 11088 Caminito Alvarez, San Diego, Calif. 92126; Chung-Yi Lee, 3129 Bunche Ave., San Diego, Calif. 92122

[21] Appl. No.: 09/206,538

[22] Filed: Dec. 7, 1998

[51] Int. Cl.[7] .............................. H01Q 1/24; H01Q 1/38; H01Q 9/16
[52] U.S. Cl. .......................... 343/702; 343/821; 343/846
[58] Field of Search .................... 343/702, 829, 343/830, 846, 821; H01Q 1/24, 1/38, 9/16

[56] References Cited

U.S. PATENT DOCUMENTS 5,936,587  8/1999  Gudilev et al. ..................... 343/752

*Primary Examiner*—Michael C. Wilmer
*Attorney, Agent, or Firm*—Philip R. Wadsworth; Charles D. Brown; Christopher O. Edwards

[57] ABSTRACT

A balanced dipole antenna for a mobile phone comprises a radiator element and a counterpoise, both formed of a conducting material. The counterpoise is electrically isolated from the ground plane of a printed wire board (PWB) of the mobile phone. A matching network, for example, a balun, provides balanced current to the dipole antenna, resulting in a symmetric radiation pattern. The balanced dipole antenna allows superior performance over conventional antennas found in mobile phones today by enabling a user of a mobile phone to communicate effectively and uniformly in all directions, that is, 360 degrees.

18 Claims, 11 Drawing Sheets

BALANCED DIPOLE ANTENNA FOR MOBILE PHONES

BACKGROUND OF THE INVENTION

I. Field of the Invention

The present invention relates generally to antennas. More specifically, the present invention relates to a balanced dipole antenna for mobile phones.

II. Description of the Related Art

Recent advancements in electronics have significantly improved the performance of mobile phones. For example, advancements in integrated circuit technology have led to high performance radio frequency (RF) circuits. The RF circuits are used to construct transmitters, receivers and other signal processing components typically found in mobile phones. Also, advancements in integrated circuit technology have led to a reduction in the size of RF circuits, thereby leading to a reduction in the overall size of a mobile phone.

Similarly, advancements in battery technology have resulted in smaller, lighter and longer lasting batteries used in mobile phones. These advancements have resulted in smaller and lighter mobile phones that operate for a longer period of time on a single charge.

Generally, a user of a mobile phone must be able to communicate with another user or a ground station that can be located in any direction from the user. For this reason, the antenna in the user's mobile phone must be able to receive and transmit signals from and in all directions. Consequently, it is desirable that the antenna exhibit a symmetric radiation pattern having a uniform gain in the azimuth.

Unfortunately, antennas found in today's typical mobile phones do not exhibit a symmetric radiation pattern. Mobile phones generally utilize monopole antennas (for example, a whip antenna) that, due to the presence of unbalanced currents, exhibit asymmetric radiation patterns. This is primarily due to the fact that the shape and dimension of a monopole are not equivalent to the shape and dimension of a ground plane of a printed wire board (PWB) used as a counterpoise, resulting in an unequal current distribution in the monopole and in the ground plane.

As a result, it has been recognized that there is a need for an antenna for a mobile phone that exhibits a symmetric radiation pattern.

SUMMARY OF THE INVENTION

The present invention is directed to a balanced dipole antenna for mobile phones, such as cellular and PCS phones. The balanced dipole antenna comprises a radiator element and a counterpoise formed of a conducting material. The counterpoise is electrically isolated from a printed wire board (PWB) of the mobile phone.

A balun couples the balanced dipole antenna to a signal source. The balun has a single input terminal and two output terminals. The input terminal is connected to the signal source. The first and second output terminals are connected to the radiator element and the counterpoise, respectively. The balun receives a single ended unbalanced signal from the signal source and provides the radiator element and the counterpoise with first and second signals, respectively. The first and second signals have equal magnitude but are out of phase by 180 degrees. The first and second signals produce balanced currents that are circulated in the radiator element and the counterpoise, thereby producing a symmetric radiation pattern.

Further features and advantages of the invention, as well as the structure and operation of various embodiments of the invention, are described in detail below with reference to the accompanying drawings.

BRIEF DESCRIPTION OF THE DRAWINGS

In the drawings, like reference numbers generally indicate identical, functionally similar, and/or structurally similar elements. The drawing in which an element first appears is indicated by the leftmost digit(s) in the reference number.

The present invention will be described with reference to the accompanying drawings, wherein.

DETAILED DESCRIPTION OF THE PREFERRED EMBODIMENTS

I. Overview of the Present Invention

As noted before, antennas found in today's typical mobile phones do not exhibit a symmetric radiation pattern. Mobile phones generally utilize monopole antennas that, due to the presence of unbalanced currents, exhibit asymmetric radiation patterns. This is illustrated further in FIGS. 1 and 2.

Figure 1:
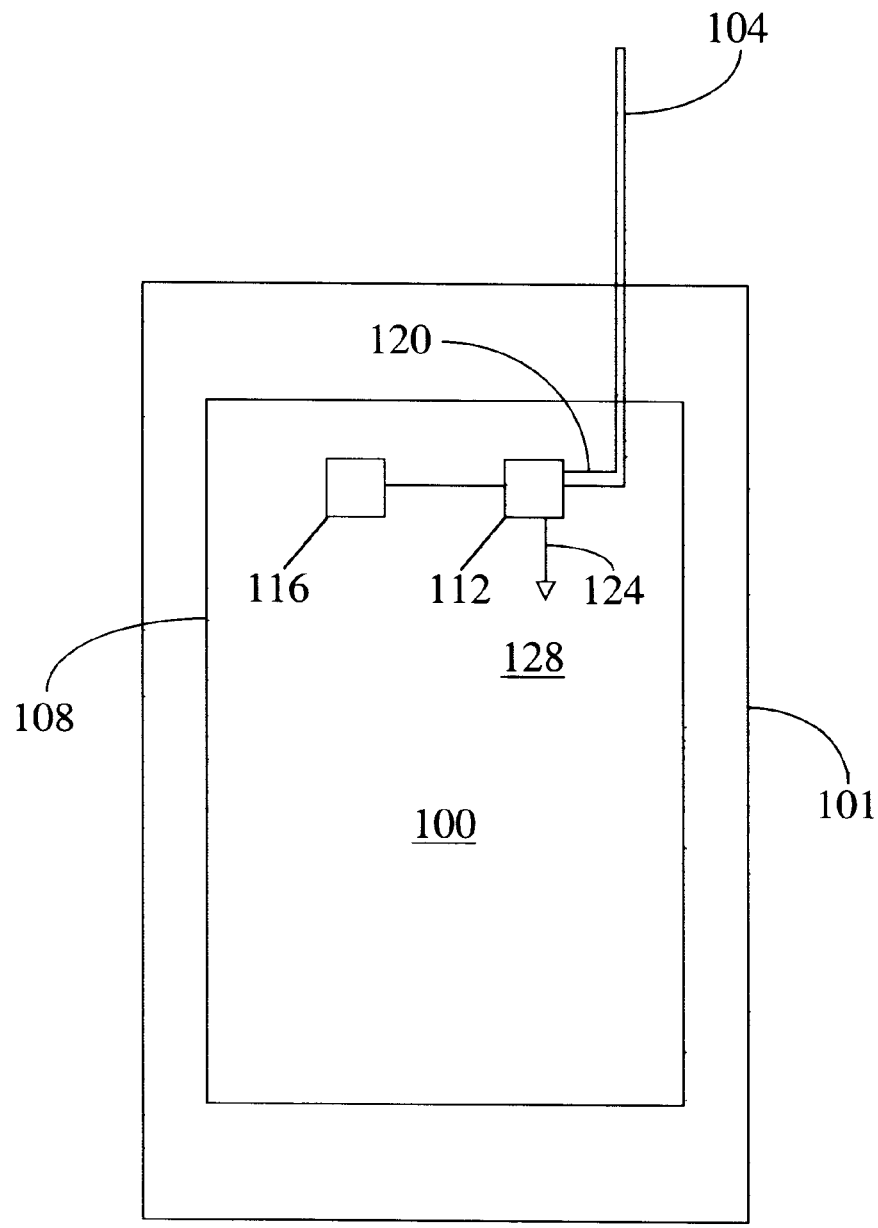
FIG. 1 illustrates a monopole antenna used in a typical mobile phone.

FIG. 1 illustrates a monopole antenna 100 used in a typical mobile phone 101. The phone 101 contains transmit/receive circuits and other ancillary electronic and mechanical components needed to send and receive calls and to perform all other normal phone operations. These components are well known and are not shown or described further as they form no part of the present invention. Monopole antenna 100 comprises a radiator (a monopole) 104, a printed wire board (PWB) 108, a reactive matching network 112 and a signal source 116. Reactive matching network 112 comprises first and second outputs 120 and 124. First output 120 is connected to monopole 104 and second output 124 is connected to ground plane 128 of PWB 108. Ground plane 128 acts as a counterpoise in order to provide a return path for currents in antenna 100.

Reactive matching network 112 forms an unbalanced feed to monopole 104. The unbalanced feed causes unbalanced currents to flow along ground plane 128. This is primarily due to the fact that the shape and dimension of monopole 104 are not equivalent to the shape and dimension of ground plane 128, resulting in unequal current distribution in monopole 104 and in ground plane 128. As a result, monopole 104 and ground plane 128 form an asymmetric dipole, thereby causing an asymmetric radiation pattern (that is, a distorted radiation pattern).

Figure 2:
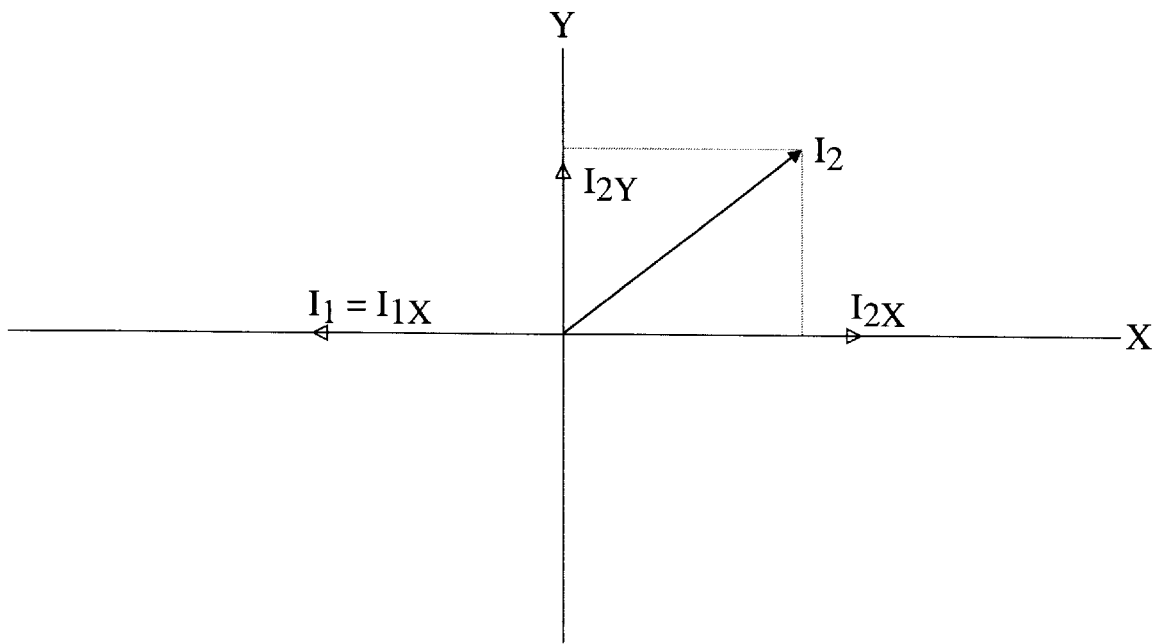
FIG. 2 shows current vectors in a monopole antenna.

FIG. 2 shows the current vectors $I_1$ and $I_2$ in monopole 104 and ground plane 128, respectively. The horizontal component $I_{2x}$ of the current $I_1$ in ground plane 128 is balanced by the horizontal component $I_{1x}$ of the current $I_1$ in monopole 104. However, the vertical component $I_{2y}$ of the current $I_2$ in ground plane 128 remains unbalanced, because of a lack of an opposing vertical component in monopole 104. The shape and dimension of monopole 104 prevent the formation of a vertical component of the current vector $I_1$. As a result, unbalanced currents flow along ground plane 128, causing a distorted radiation pattern.

Furthermore, monopole antenna 100 provides less flexibility as its radiation pattern is driven by the size and /or shape of PWB 108. Since the size and/or shape of PWB 108 are driven in large part by the size and/or shape of the mobile phone's case that houses PWB 108, designers are often handicapped in their selection of a radiation pattern by the pre-existing size and/or shape of a mobile phone's case.

The present invention provides a solution to the aforementioned problems. The present invention is a balanced dipole antenna for a mobile phone, for example, a PCS phone or a cellular phone. The present invention advantageously incorporates a balanced dipole antenna in a mobile phone that significantly improves the radiation pattern of a mobile phone. Furthermore, the present invention allows designers to select desired radiation patterns for mobile phones without being constrained by the shape of PWBs.

Briefly stated, the balanced dipole antenna comprises a radiator element and a counterpoise, both formed of a conducting material. The counterpoise is electrically isolated from the ground plane of a printed wire board (PWB) of the mobile phone. A matching network, for example, a balun, provides balanced current to the dipole antenna, resulting in a symmetric radiation pattern. The balanced dipole antenna allows superior performance over conventional antennas found in mobile phones today by enabling a user of a mobile phone to communicate uniformly in all directions, that is, 360 degrees.

Figure 3:
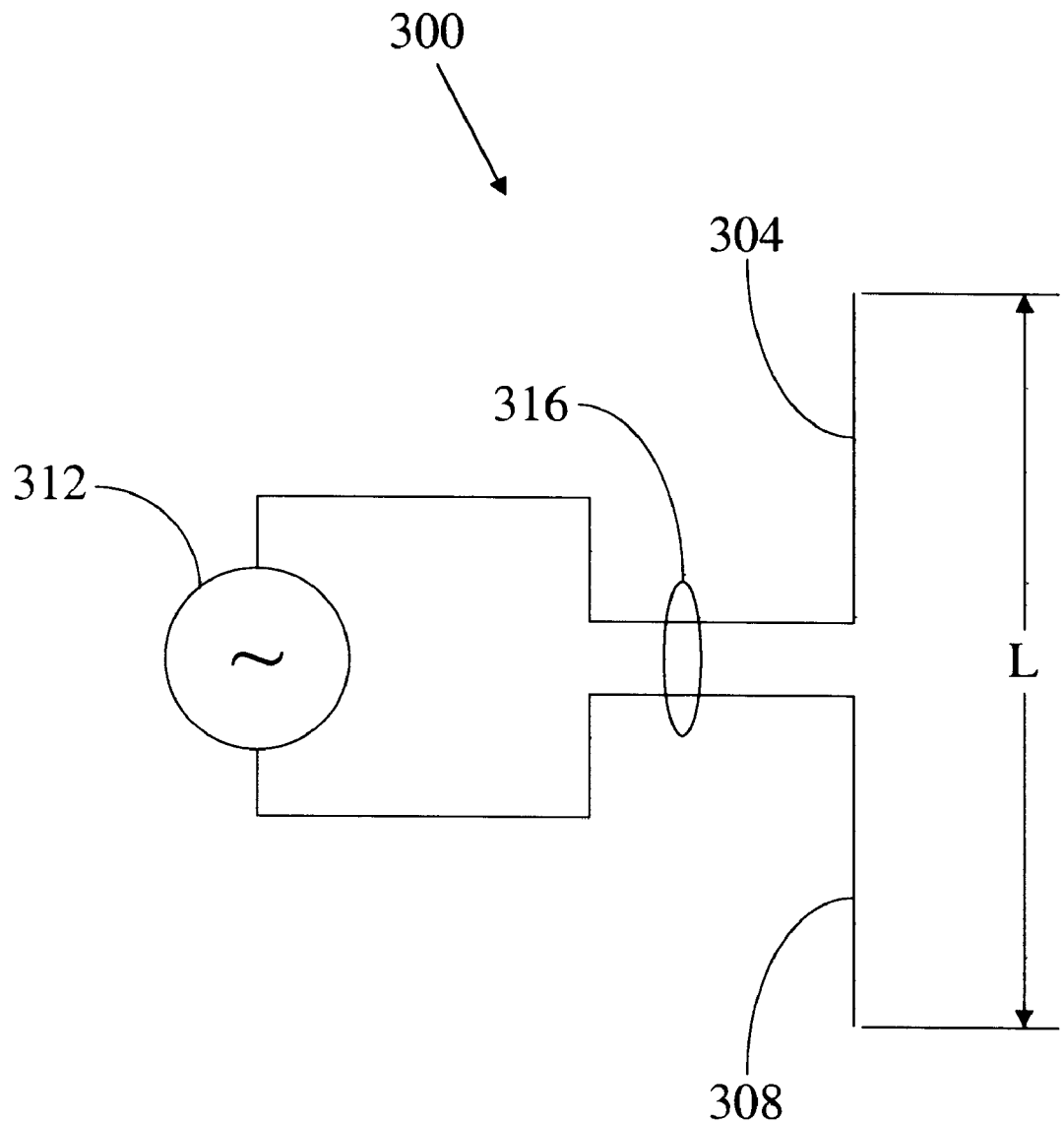
FIG. 3 illustrates a dipole antenna.

As noted above, the present invention incorporates the advantages of a dipole antenna in a mobile phone. Simply stated, a dipole antenna is a diverging two-wire transmission line. FIG. 3 illustrates a dipole antenna 300. Dipole antenna 300 comprises first and second radiators 304 and 308, respectively, connected to a signal source 312 by a two-wire transmission line 316.

Figure 4:
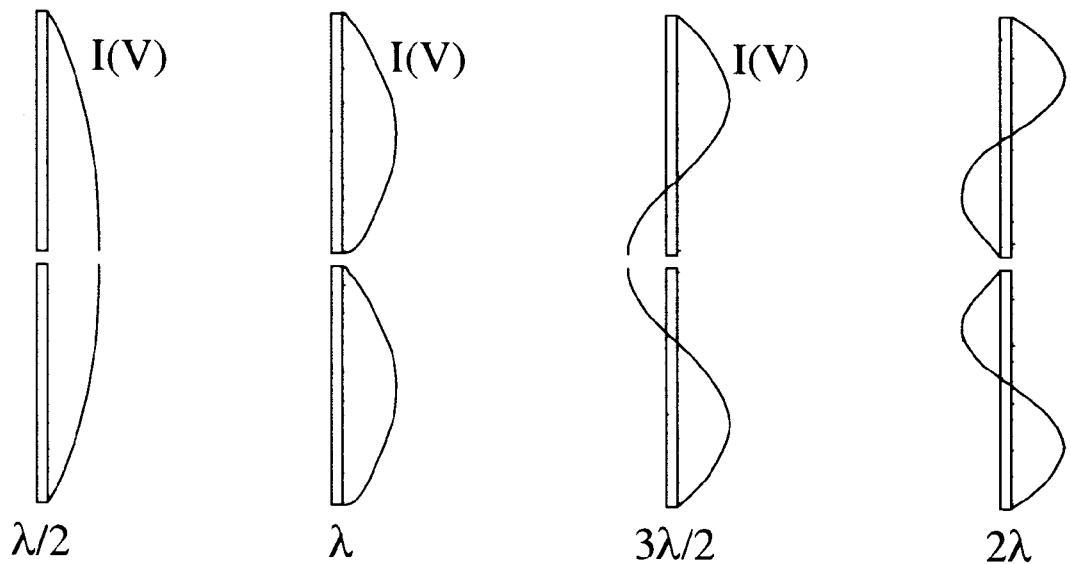
FIG. 4 shows current distributions in dipole antennas of different lengths.

Dipole antenna 300 can be of any length L, such as L=$\lambda$, $\lambda/2$, $\lambda/4$, where $\lambda$ corresponds to the wavelength of the operating frequency f of dipole antenna 300. The current distributions in first and second radiators 304 and 308 are sinusoidal provided that the diameter of each radiator is less than $\lambda/100$. Examples of the approximate current distributions in a number of dipole antennas of different lengths are illustrated in FIG. 4.

Figure 5A:
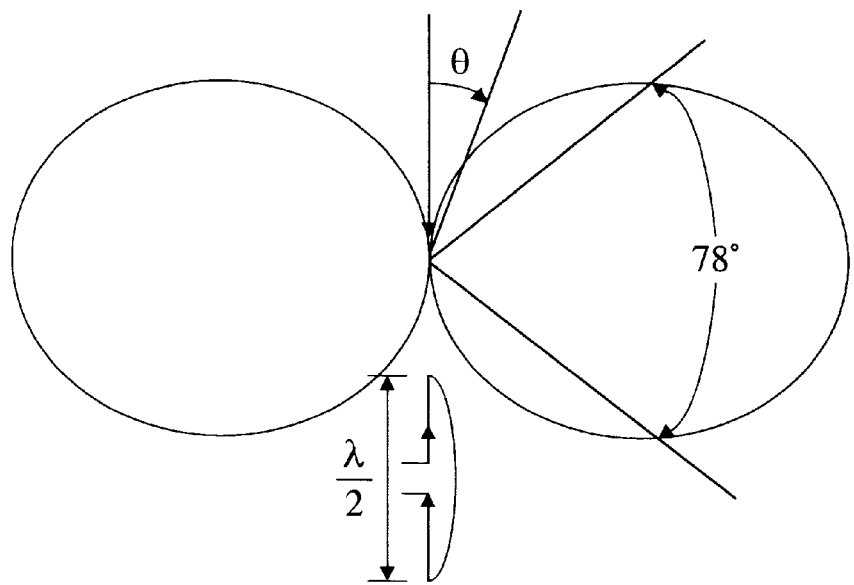
FIG. 5A illustrates the radiation patterns of a half wavelength dipole antenna.
Figure 5B:
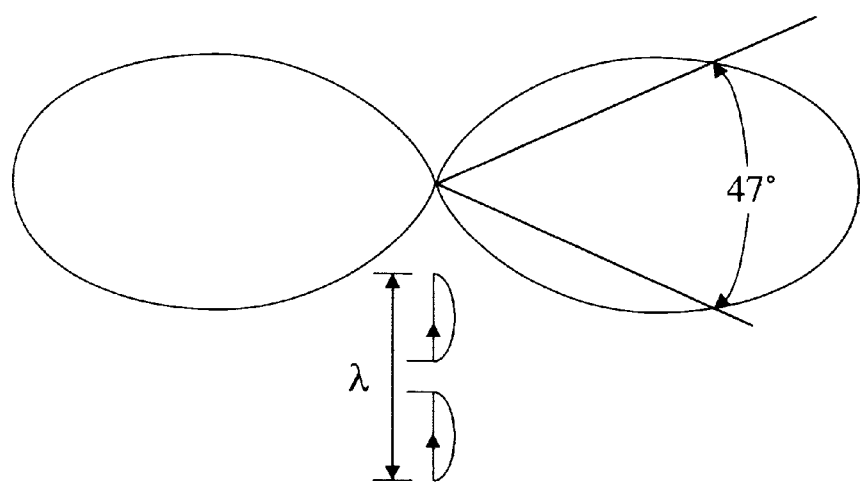
FIG. 5B illustrates the radiation pattern of a full wavelength dipole antenna.

Dipole antenna 300 exhibits a symmetric radiation pattern. A symmetric radiation pattern provides uniform gain in 360 degrees, thereby allowing equally effective communication in all directions. FIGS. 5A and 5B illustrate the radiation pattern of dipole antenna 300 having selected lengths. The current distribution in dipole antenna 300 is assumed to be sinusoidal.

FIG. 5A illustrates the radiation pattern of a dipole antenna having a length L=$\lambda/2$. The radiation pattern for L=$\lambda/2$ is given by the following equation.

$$E = \cos[(\pi/2)\cos\theta]/\sin\theta$$

FIG. 5B illustrates the radiation pattern of a dipole antenna having a length L=$\lambda$. The radiation pattern for L=$\lambda$ is given by the following equation.

$$E = \cos(\pi\cos\sigma) + 1/\sin\theta$$

II. The Invention

Figure 6:
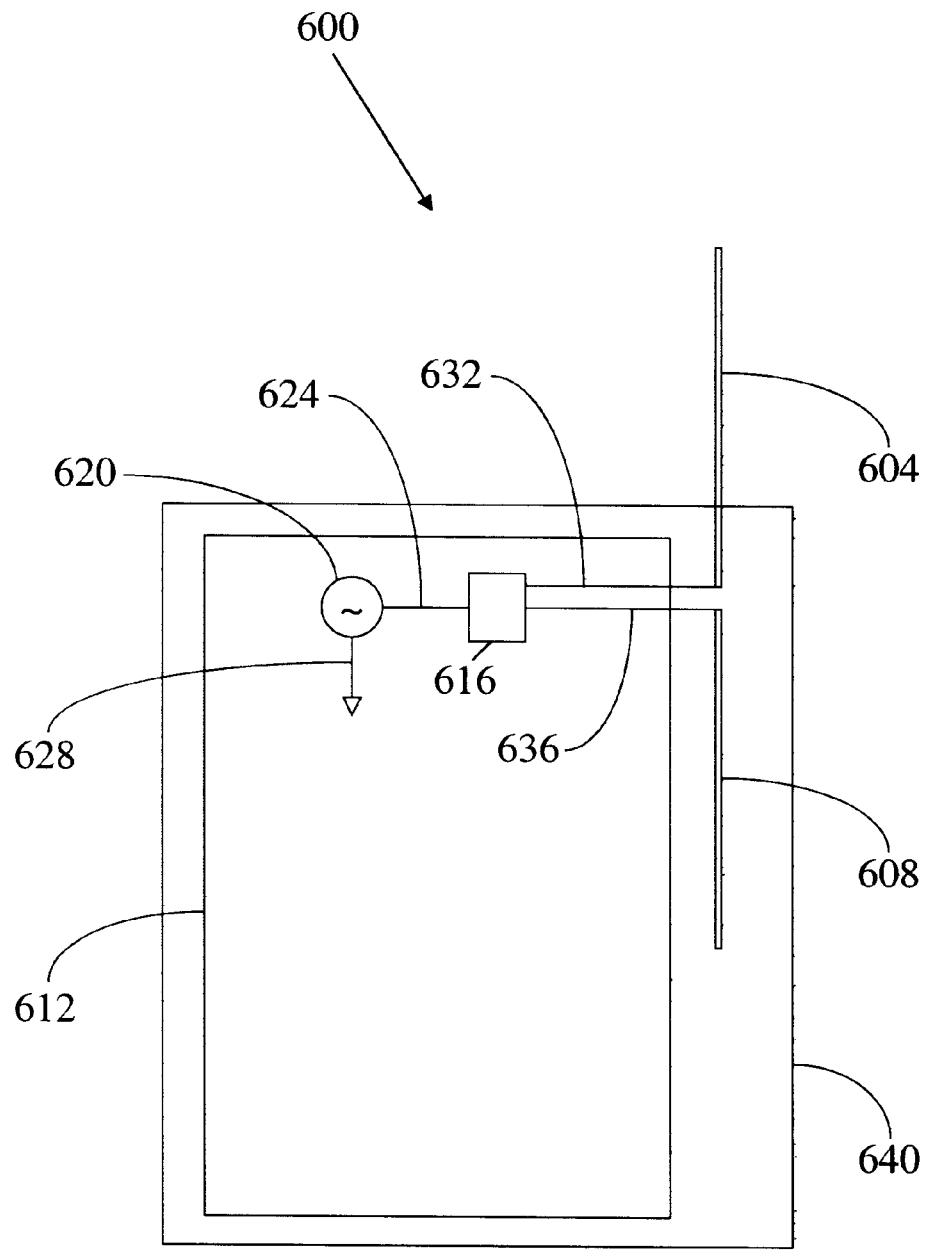
FIG. 6 illustrates a balanced dipole antenna according to one embodiment of the present invention.

FIG. 6 illustrates a balanced dipole antenna 600 according to one embodiment of the present invention. Antenna 600 comprises a radiator 604, a counterpoise 608, a PWB 612 and a balun 616.

A signal source 620 is connected to balun 616. Signal source 620 has first and second terminals 624 and 628, respectively. First terminal 624 is connected to balun 616, whereas second terminal 628 is grounded. In one embodiment, signal source 620 is mounted on PWB 612. In operation, signal source 620 provides a single ended RF signal to balun 616 by first terminal 624.

In addition to signal source 620, PWB 612 supports on board circuitry, such as, a receiver, a transmitter, and other signal processing circuitry needed for a mobile phone's operation. PWB 612 has a ground plane 644 that provides a ground for all on board circuitry.

In general, the purpose of a balun is to connect a balanced antenna to an unbalanced source (or an unbalanced transmission line). In this embodiment, balun 616 connects radiator 604 and counterpoise 608 to an unbalanced source, that is, signal source 620. Since the output of signal source 620 is single ended, it is unbalanced. If the single ended output from signal source 620 is directly coupled to radiator 604 and counterpoise 608, it would result in unbalanced currents in antenna 600. Thus, balun 616 is used to convert an unbalanced source to a balanced source.

Balun 616 has first and second output terminals 632 and 636, respectively. First and second output terminals 632 and 636 are connected to radiator 604 and counterpoise 608, respectively. Balun 616 converts the single ended signal to first and second signals that are provided to radiator 604 and counterpoise 608, respectively. First and second signals have equal magnitudes, but are out of phase by 180 degrees. The operation of balun 616 is described in detail later.

In order for antenna 600 to operate satisfactorily, counterpoise 608 must be electrically isolated from ground plane 644 of PWB 612. Isolation of counterpoise 608 ensures that current will not flow from counterpoise 608 to ground plane 644. If counterpoise 608 is not electrically isolated from ground plane 644, unbalanced currents will flow along ground plane 644, thereby resulting in a distorted radiation pattern. Isolation for counterpoise 608 can be provided by maintaining a gap between PWB 612 and counterpoise 608. For example, counterpoise 608 can be placed parallel to PWB 612 as shown in FIG. 6. Alternatively, counterpoise 608 can be constructed on PWB 612 by various known techniques described later. In that case, counterpoise 608 is generally separated from ground plane 644 by a dielectric material.

When radiator 604 and counterpoise 608 are excited by a first and a second signal, respectively, having equal magnitude, but which are out of phase by 180 degrees, balanced currents circulate in the radiator and the counterpoise. As a result, antenna 600 produces a symmetric radiation pattern.

Counterpoise 608 will generally be enclosed inside the mobile phone's housing 640. In other words, counterpoise 608 will not be visible from the outside. Radiator 604, on the other hand, will generally extend out of mobile phone's housing 640. Thus, from the exterior, the present invention will not alter a mobile phone's appearance.

In one embodiment, radiator 604 and counterpoise 608 have substantially similar dimensions and/or shapes. However, radiator 604 and counterpoise 608 may have dissimilar shapes and/or dimensions. Counterpoise 608 may be printed on PWB 612. Alternatively, counterpoise 608 may be a metallic strip embedded in a mobile phone's case. Counterpoise 608 may be constructed using other techniques known in the art.

Although, the balanced dipole antenna according to the present invention has been described as a linear dipole antenna, it will become apparent to one skilled in the art, that the underlying concept behind the present invention can be adapted to other antennas in mobile phones as well. In fact, the concept of the present invention can be advantageously utilized in other types of antennas in mobile phones to thereby provide balanced currents.

In one embodiment, the length of antenna 600 is $\lambda$, where $\lambda$ is a wavelength corresponding to an operating frequency. The length of the antenna is the total length of radiator 604 and counterpoise 608. Other lengths can be used, such as, $\lambda/2$, $\lambda/4$, etc. In one embodiment, antenna 600 is sized to operate over a cellular frequency band (approximately 900 MHz). In another embodiment, antenna 600 is sized to operate over a PCS frequency band (approximately 1.9 GHz).

Figure 7B:
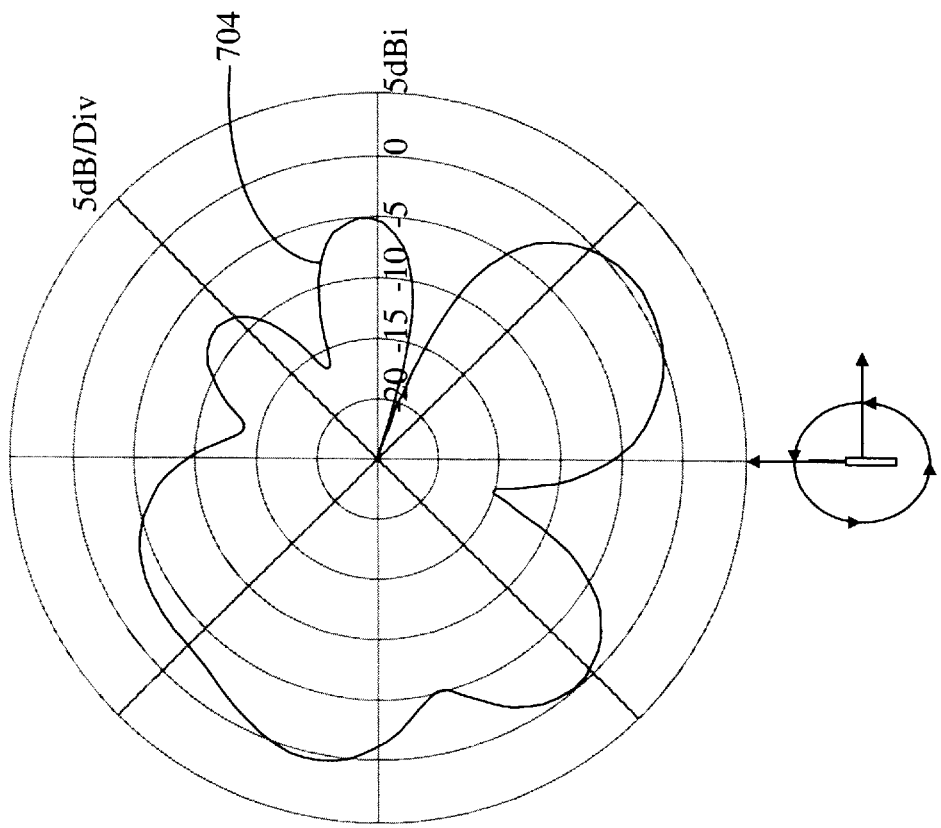
FIGS. 7A and 7B illustrate computer simulated field patterns of a conventional antenna.
Figure 7A:
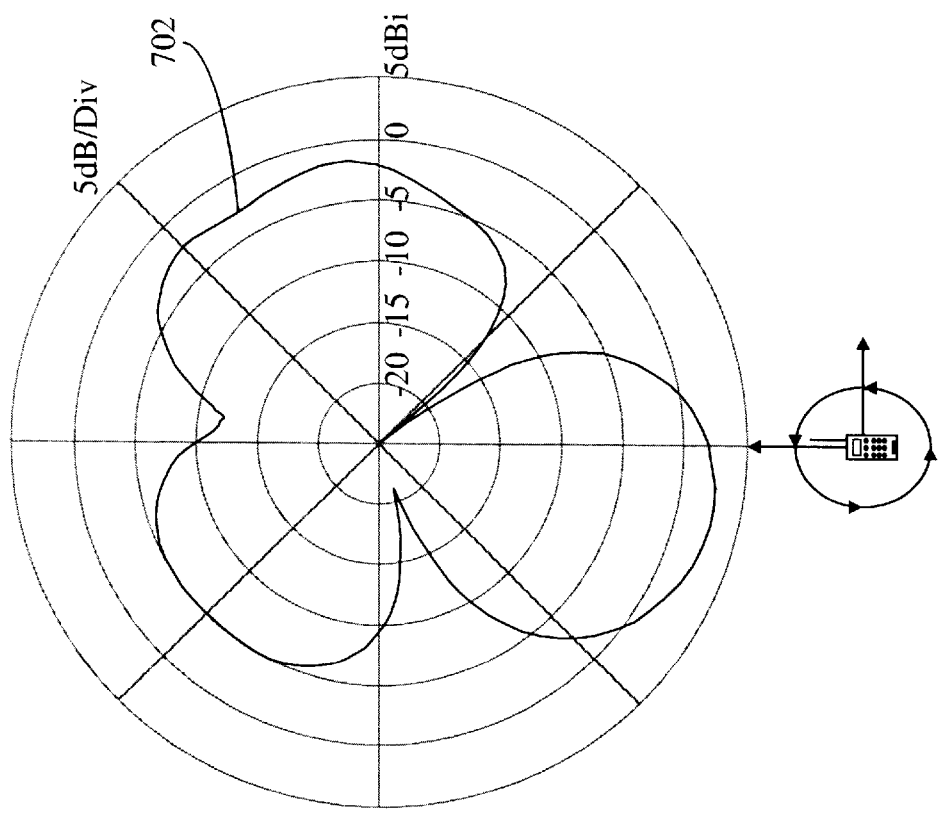

FIGS. 7A and 7B illustrate computer simulated field patterns of antenna 100, that is, a conventional whip antenna used in a typical mobile phone, operating at 1.99 GHz. FIG. 7A illustrates a front face pattern 702 (measured from the front of the mobile phone) and FIG. 7B illustrates a side view pattern 704 (measured from the side of the mobile phone). In both cases, the field patterns of antenna 100 are asymmetric. As a result, antenna 100 does not transmit or receive signals uniformly in all directions.

Figure 8B:
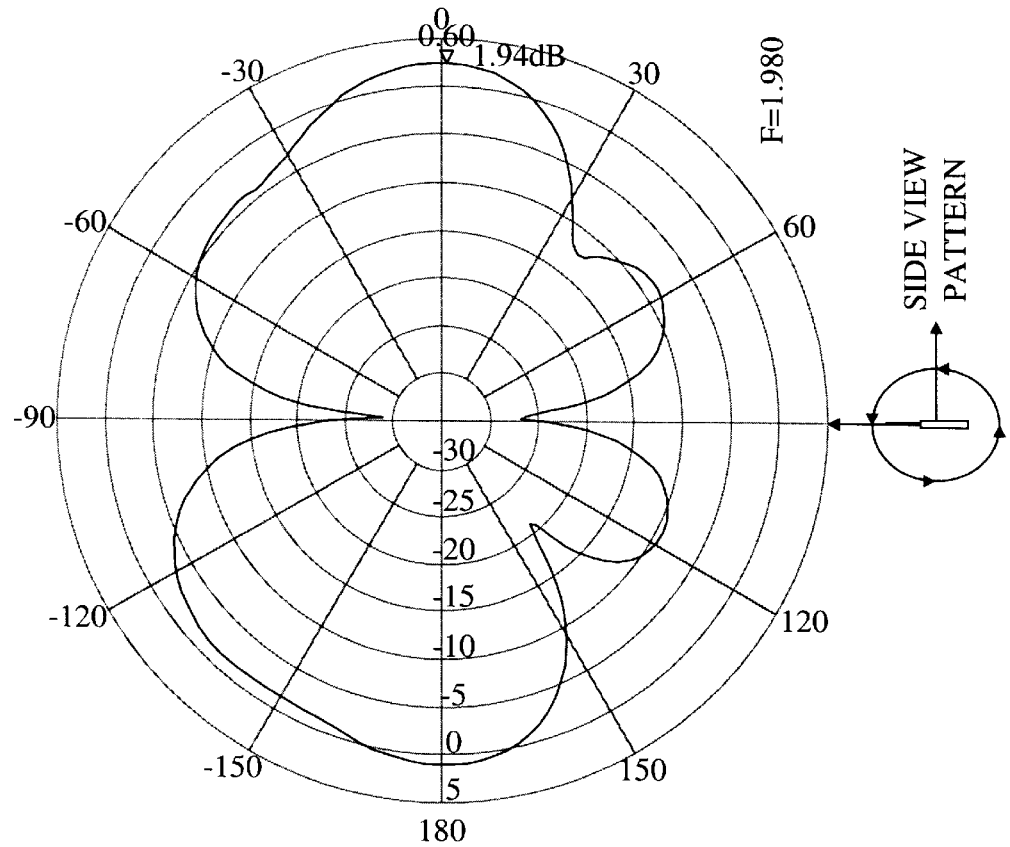
FIGS. 8A and 8B illustrate computer simulated field patterns of a balanced dipole antenna according to one embodiment.
Figure 8A:
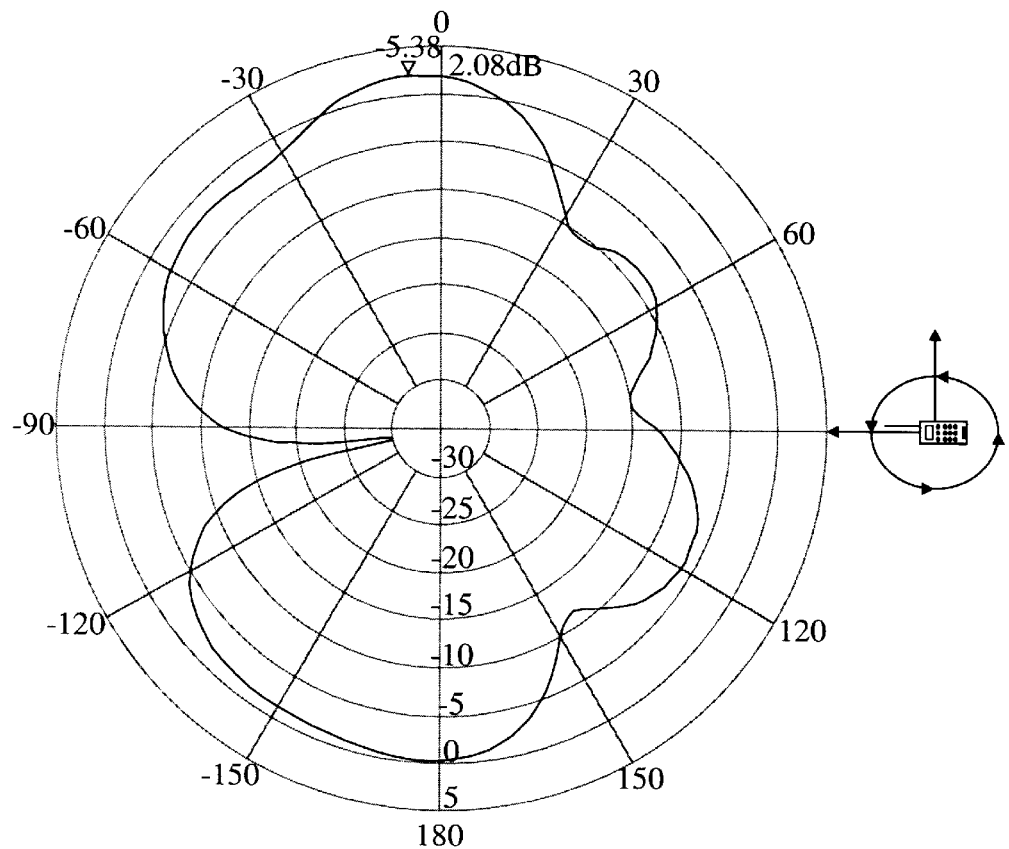

FIGS. 8A and 8B illustrate computer simulated electric field patterns of balanced dipole antenna 600 operating at 1.99 GHz. FIG. 8A illustrates a front face pattern and FIG. 8B illustrates a side view pattern. In both cases, the field patterns are quite symmetric. In the case of the front face pattern, the maximum electric field is 2.08 dB at −5.38 degrees, while in the case of the side view pattern, the maximum electric field is 1.94 dB at 0 degree. FIGS. 8A and 8B clearly demonstrate the improvements in field patterns exhibited by the balanced dipole antenna according to the present invention over a conventional antenna.

Figure 9:
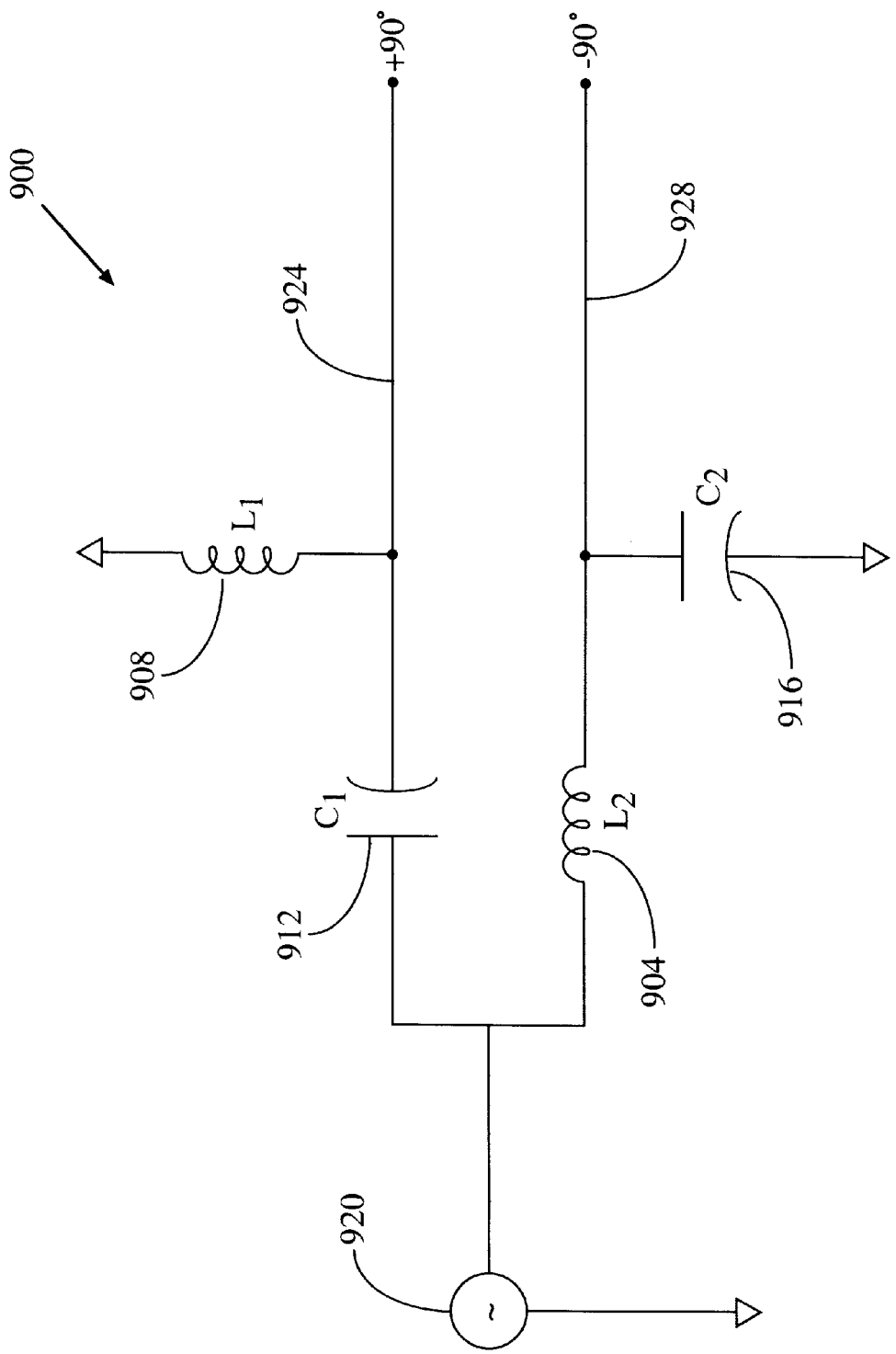
FIGS. 9, 10 and 11 illustrate baluns in accordance with three embodiments of the present invention.

FIG. 9 illustrates a balun 900 in accordance with one embodiment. Balun 900 receives a single ended, unbalanced signal from a signal source and outputs a balanced signal to a dipole antenna. Balun 900 comprises two inductors 904, 908 and two capacitors 912, 116. Inductor 904 and capacitor 912 are connected at one end to a signal source 920. Inductor 908 is connected at one end to capacitor 912 while the other end of inductor 908 is grounded. Capacitor 916 is connected at one end to inductor 904 while the other end of capacitor 916 is grounded. Output signals 924 and 928 are balanced and are phase shifted from each other by 180 degrees.

Figure 10:
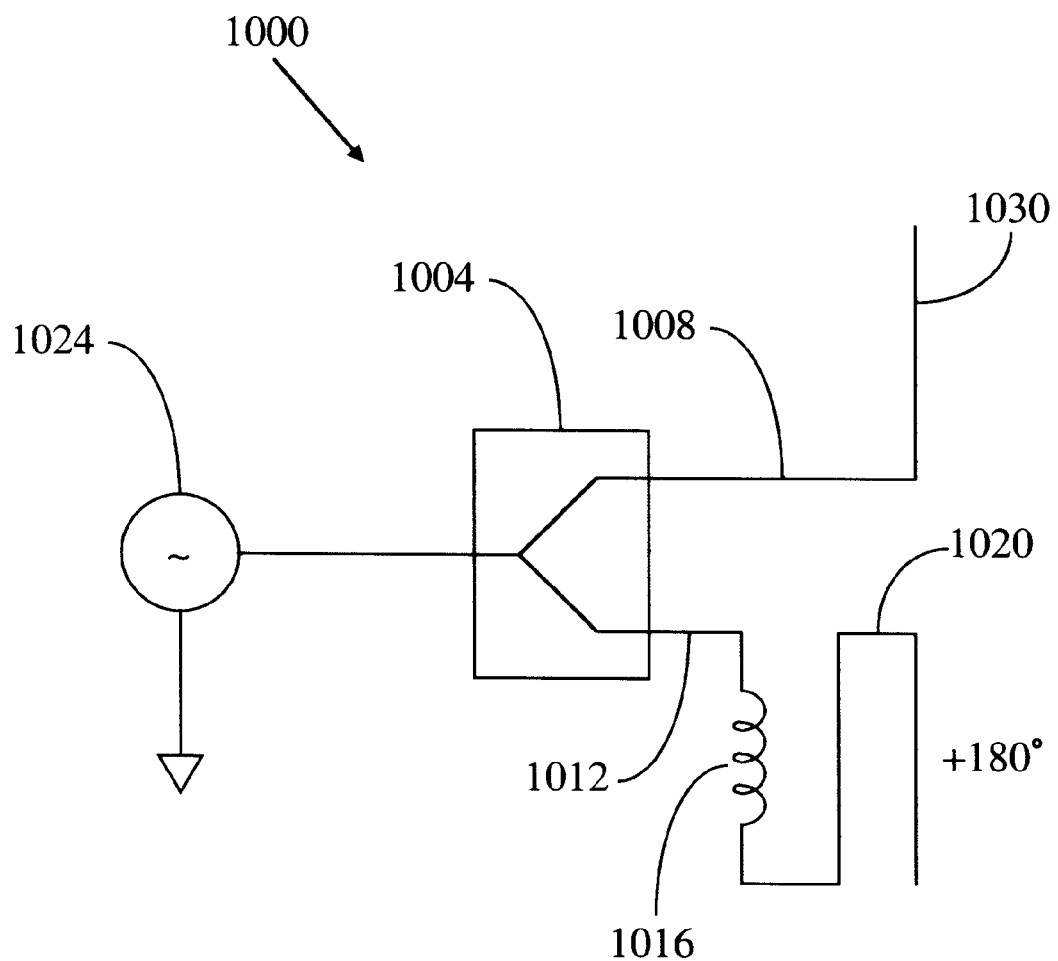

FIG. 10 illustrates a balun 1000 in accordance with another embodiment. Balun 1000 comprises a power splitter 1004 that receives a single ended output from a signal source 1024 and outputs a balanced signal at output terminals 1008 and 1012. An inductor or choke 1016 is connected in series to an output terminal 1012. Output terminal 1008 is connected to a radiator 1030, while output 1012 is connected to a counterpoise 1020 through inductor 1016.

The function of the power splitter 1004 is to split a signal from signal source 1024 into two signals each having an equal magnitude. The first signal is provided to radiator 1030. The second signal is phase shifted 180° by inductor 1016 and the phase shifted signal is then provided to counterpoise 1020. Baluns 900 and 1000 are described as illustrative examples only.

Figure 11:
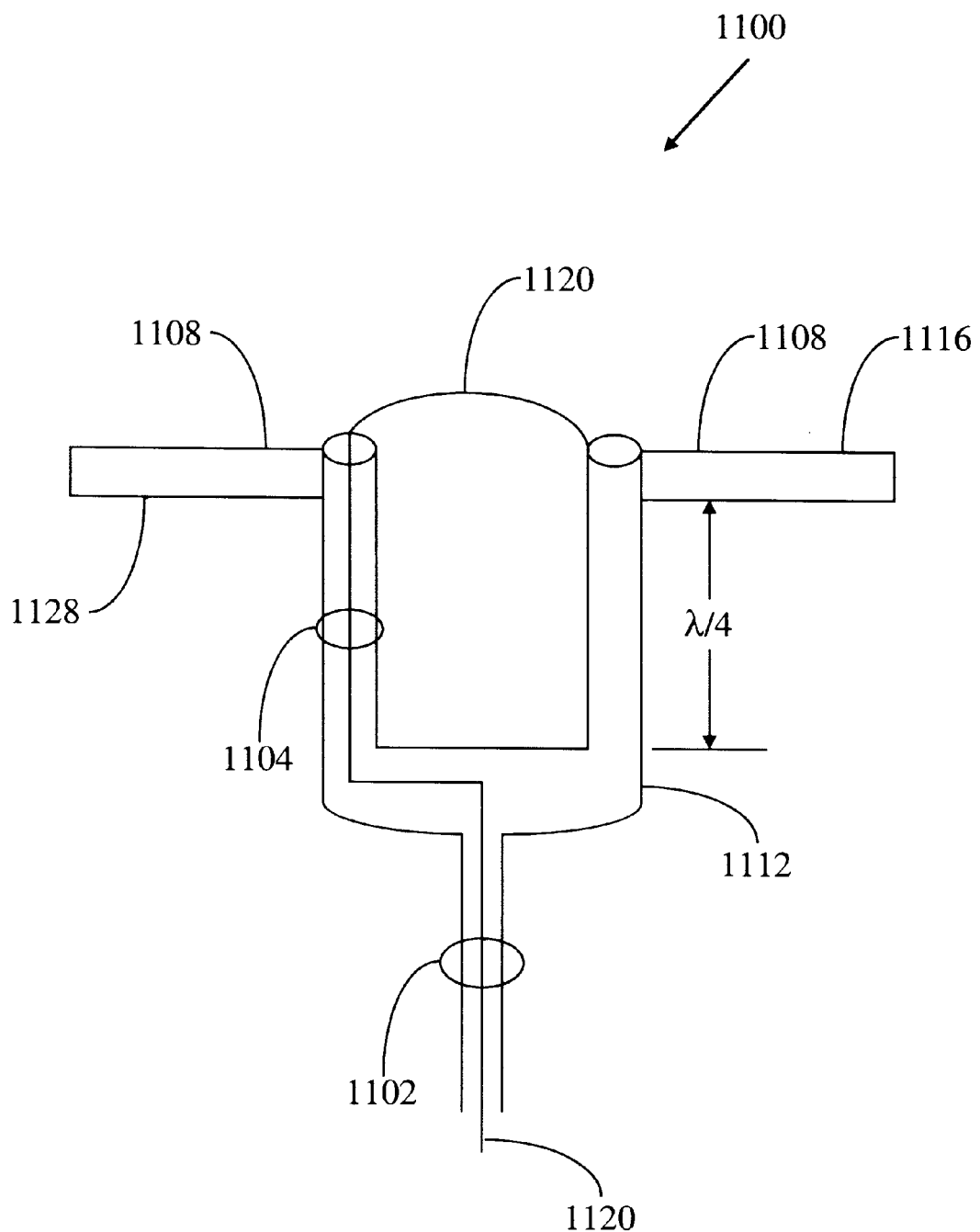

FIG. 11 illustrates a folded balun 1100 that allows direct connection of a coaxial line 1102 to a dipole antenna 1108. A coax outer conductor 1112 is connected to a pole 1116 fed from a center conductor 1120. Coax 1112 runs alongside a feeder coax 1104 for a quarter wavelength. Another pole 1128 connects directly to the shield of feeder coax 1104. While a few selected baluns have been described, it will become apparent to persons skilled in the art that other types of baluns can be easily used in the present invention.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A balanced dipole antenna for a mobile phone having a signal source, transmit and receive circuits, and a printed wire board (PWB) having a ground plane formed thereon for the signal source and for the transmit and receive circuits, comprising:

a radiator element formed of a conducting material;

a counterpoise formed of a conducting material and electrically isolated from the PWB ground plane; and a signal balancing means coupled between the signal source and said radiator element and counterpoise to generate first and second signals, respectively, that are substantially equal in magnitude but out of phase by 180 degrees, said signal balancing means comprising:

a first capacitor having a first end connected to an input terminal and a second end connected to a first output terminal;

a first inductor having a first end connected to said first output terminal and a second end connected to said ground plane;

a second inductor having a first end connected to said input terminal and a second end connected to a second output terminal, and a second capacitor having a first end connected to said second output terminal and a second end connected to said ground plane, wherein balanced currents are circulated in said radiator element and said counterpoise to thereby produce a symmetric radiation pattern.

2. The balanced dipole antenna as recited in claim 1, wherein said signal balancing means comprises:

an input terminal connected to the signal source; and first and second output terminals connected to said radiator element and said counterpoise, respectively, wherein said signal balancing means receives a single ended unbalanced signal from the signal source and outputs said first and second signals.

3. The balanced dipole antenna as recited in claim 1, wherein said radiator element and said counterpoise have substantially equal dimensions.

4. The balanced dipole antenna as recited in claim 1, wherein said radiator element and said counterpoise have substantially similar shapes.

5. The balanced dipole antenna as recited in claim 1, wherein said counterpoise is printed on the PWB.

6. The balanced dipole antenna as recited in claim 1, wherein said counterpoise is a conducting wire.

7. The balanced dipole antenna as recited in claim 1, wherein said counterpoise is a metallic strip.

8. The balanced dipole antenna as recited in claim 1, wherein said first and second signals are in cellular frequency band.

9. The balanced dipole antenna as recited in claim 1, wherein said first and second signals are in PCS frequency band.

10. The balanced dipole antenna as recited in claim 1, wherein the total length of said radiator element and said counterpoise is $\lambda$, where $\lambda$ is the wavelength corresponding to an operating frequency.

11. The balanced dipole antenna as recited in claim 1, wherein the total length of said radiator element and said counterpoise is $\lambda/2$, where $\lambda$ is the wavelength corresponding to an operating frequency.

12. A balanced dipole antenna for a mobile phone having a signal source, transmit and receive circuits, and a printed wire board (PWB) having a ground plane formed thereon for the signal source and for the transmit and receive circuits, comprising:

a first dipole element formed of a conducting material and electrically isolated from the PWB ground plane;

a second dipole element formed of a conducting material and electrically isolated from the PWB ground plane; and a signal balancing means coupled between the signal source and said first and second dipole elements to generate first and second signals, respectively, that are substantially equal in magnitude but out of phase by 180 degrees, wherein said signal balancing means comprises a coaxial cable having an inner conductor and an outer conductor, said outer conductor having first and second branches, said inner conductor extending coaxially within said first outer conductor branch, said first outer conductor branch being electrically coupled to said first dipole element, and said inner conductor being electrically coupled to said second dipole element, and said second outer conductor branch being electrically connected to said second dipole element;

wherein balanced currents are circulated in said first and second dipole elements to thereby produce a symmetric radiation pattern.

13. A balanced dipole antenna for a mobile phone having a signal source, transmit and receive circuits, and a printed wire board (PWB) having a ground plane formed thereon for the signal source and for the transmit and receive circuits, comprising:

a radiator element formed of a conducting material;

a counterpoise formed of a conducting material and electrically isolated from the PWB ground plane; and a signal balancing means coupled between the signal source and said radiator element and counterpoise to generate first and second signals, respectively, that are substantially equal in magnitude but out of phase by 180 degrees, said signal balancing means comprising a power splitter having an input terminal and first and second output terminals, said input terminal being connected to the signal source and said first output terminal being connected to said radiator element; and an inductor connected in series between said second output terminal and said counterpoise wherein balanced currents are circulated in said radiator element and said counterpoise to thereby produce a symmetric radiation pattern.

14. The balanced dipole antenna as recited in claim 13, wherein said signal balancing means comprises:

an input terminal connected to the sign al source; and first and second output terminals connected to said radiator element and said counterpoise, respectively, wherein said signal balancing means receives a single ended unbalanced signal from the signal source and outputs said first and second signals.

15. The balanced dipole antenna as recited in claim 13, wherein said radiator element and said counterpoise have substantially equal dimensions.

16. The balanced dipole antenna as recited in claim 13, wherein said radiator element and said counterpoise have substantially similar shapes.

17. The balanced dipole antenna as recited in claim 13, wherein said counterpoise is printed on the PWB.

18. The balanced dipole antenna as recited in claim 13, wherein said counterpoise is a conducting wire.

\* \* \* \* \*